United States Patent [19]

Hanawa

[11] Patent Number: 5,614,060
[45] Date of Patent: Mar. 25, 1997

[54] PROCESS AND APPARATUS FOR ETCHING METAL IN INTEGRATED CIRCUIT STRUCTURE WITH HIGH SELECTIVITY TO PHOTORESIST AND GOOD METAL ETCH RESIDUE REMOVAL

[75] Inventor: Hiroji Hanawa, Sunnyvale, Calif.

[73] Assignee: Applied Materials, Inc., Santa Clara, Calif.

[21] Appl. No.: 409,388

[22] Filed: Mar. 23, 1995

[51] Int. Cl.⁶ .............................. H01L 21/00; H05H 1/00
[52] U.S. Cl. .................................... 156/643.1; 156/656.1; 156/345
[58] Field of Search ............................ 156/643.1, 646.1, 156/656.1, 345; 134/1, 1.1, 1.2

[56] References Cited

U.S. PATENT DOCUMENTS

| | | | |
|---|---|---|---|
| 4,500,563 | 2/1985 | Ellenberger et al. | 156/643.1 X |
| 4,808,258 | 2/1989 | Otsubo et al. | 156/345 X |
| 5,261,965 | 11/1993 | Moslehi | 134/1 |
| 5,310,452 | 5/1994 | Doki et al. | 156/345 X |
| 5,352,324 | 10/1994 | Gotoh et al. | 156/345 X |
| 5,433,258 | 7/1995 | Barnes et al. | 156/345 X |
| 5,435,886 | 7/1995 | Fujiwara et al. | 156/643.1 |

*Primary Examiner*—Thi Dang
*Attorney, Agent, or Firm*—John P. Taylor

[57] ABSTRACT

A process and apparatus are described for patterning a masked metal layer to form a layer of metal interconnects for an integrated circuits structure which removes metal etch residues, while inhibiting or eliminating erosion of the photoresist mask, by providing an amplitude modulation of the RF bias power supplied to the substrate support of the substrate being etched. The amplitude modulation of the RF power superimposes short pulses of RF power of sufficient magnitude (pulse height) and of sufficient duration (pulse width) to remove metal etch residues as they form during the etch process without, however, eroding the photoresist etch mask during the etch process sufficiently to adversely impact the patterning of the metal layer.

22 Claims, 3 Drawing Sheets

PATTERNING A METAL LAYER ON A SUBSTRATE OF AN INTEGRATED CIRCUIT STRUCTURE HAVING A PHOTORESIST MASK THEREON USING A BIAS POWER APPLIED TO THE SUBSTRATE WHICH IS MODULATED WITH PULSES OF HIGH BIAS POWER SUFFICIENT TO REMOVE METAL ETCH RESIDUES WITHOUT ERODING THE MASK OR UNDERCUTTING THE METAL LAYER

PROVIDING A REPETITION RATE OF SUCH HIGH BIAS POWER PULSES OF AT LEAST ABOUT 5 KHZ

PROVIDING A MAGNITUDE OR PULSE HEIGHT OF SUCH HIGH BIAS POWER PULSES RANGING FROM AT LEAST ABOUT 200 WATTS TO ABOUT 1000 WATTS

PROVIDING A DURATION OR PULSE WIDTH OF SUCH HIGH BIAS POWER PULSES RANGING FROM AT LEAST ABOUT 5% TO ABOUT 40% OF THE DUTY CYCLE OF THE HIGH BIAS POWER PULSES

FIG. 6

PROCESS AND APPARATUS FOR ETCHING METAL IN INTEGRATED CIRCUIT STRUCTURE WITH HIGH SELECTIVITY TO PHOTORESIST AND GOOD METAL ETCH RESIDUE REMOVAL

BACKGROUND OF THE INVENTION

1. Field of the Invention

This invention relates to a process and apparatus for etching metal useful in the formation of integrated circuit structures. More particularly, this invention relates to a process and apparatus for etching metal portions of integrated circuit structure which exhibits high selectivity to photoresist mask material while also exhibiting good removal of metal etch residues.

2. Description of the Related Art

In the construction of integrated circuit structures, one or more metal interconnect layers are used to electrically connect together individual semiconductor devices formed on a substrate to thereby form desired electronic circuits. Conventionally such metal interconnects are constructed by first depositing a metal layer over the structure and then patterning the metal layer by forming a photoresist mask over the metal layer and then etching the exposed portions of the metal layer. The metal layer usually comprises aluminum and a low pressure plasma etch, using chlorine-based chemistry, is generally used to etch the aluminum metal. However, the aluminum metal used to form such aluminum metal interconnects typically comprises an alloy of aluminum and another metal, e.g., copper, in minor amounts, i.e., 10 wt. % or less, and may also contain small amounts of impurities. Such alloying materials and impurities can produce etch residues during the patterning of the metal layer, which residues must also be removed from the surface of the integrated circuit structure.

The successful removal of such residues has, in the past, required the use of high energy ion bombardment which is obtained by applying a high bias power to the substrate support on which the substrate rests during the etching process. By high power is meant a bias power equivalent to a bias power of at least 200 watts when a metal layer on a six inch diameter silicon substrate is being etched, with such equivalent power levels sometimes reaching as high as 1000 watts. While the use of such high bias power will result in successful removal of etch residues generated during the patterning of the metal layer, such a solution, in turn, generates a further problem: erosion of the photoresist mask. Erosion of the photoresist etch mask, in turn, can result in too much of the metal being etched away, resulting in an undesirable thinning and/or undercutting of the metal lines, or in extreme cases, complete etching away of the metal lines, resulting in an open circuit in the wiring structure being created. Such erosion of the photoresist mask can begin to occur when an equivalent bias power of greater than about 100 watts is used, and this erosion reaches an unsatisfactory level when equivalent bias power levels as high as 200 watts are utilized.

It would, therefore, be desirable to have a process and apparatus for the patterning of a metal layer in the construction of an integrated circuit structure wherein etch residues formed during the etching of the metal layer would be removed during the patterning process while still inhibiting or eliminating erosion of the photoresist mask.

SUMMARY OF THE INVENTION

The invention provides a process and apparatus for patterning a masked metal layer to form a layer of metal interconnects for an integrated circuit structure which removes metal etch residues, while inhibiting or eliminating erosion of the photoresist mask, by providing an amplitude modulation of the RF bias power supplied to the substrate being etched. The amplitude modulation of the RF power superimposes short pulses of RF power of sufficient magnitude (pulse height) and of sufficient duration (pulse width) to remove metal etch residues as they form during the etch process without, however, eroding the photoresist etch mask during the etch process sufficiently to adversely impact the patterning of the metal layer.

BRIEF DESCRIPTION OF THE DRAWINGS

FIG. 6 is a flowsheet illustrating the process of the invention.

DETAILED DESCRIPTION OF THE INVENTION

Figure 1:
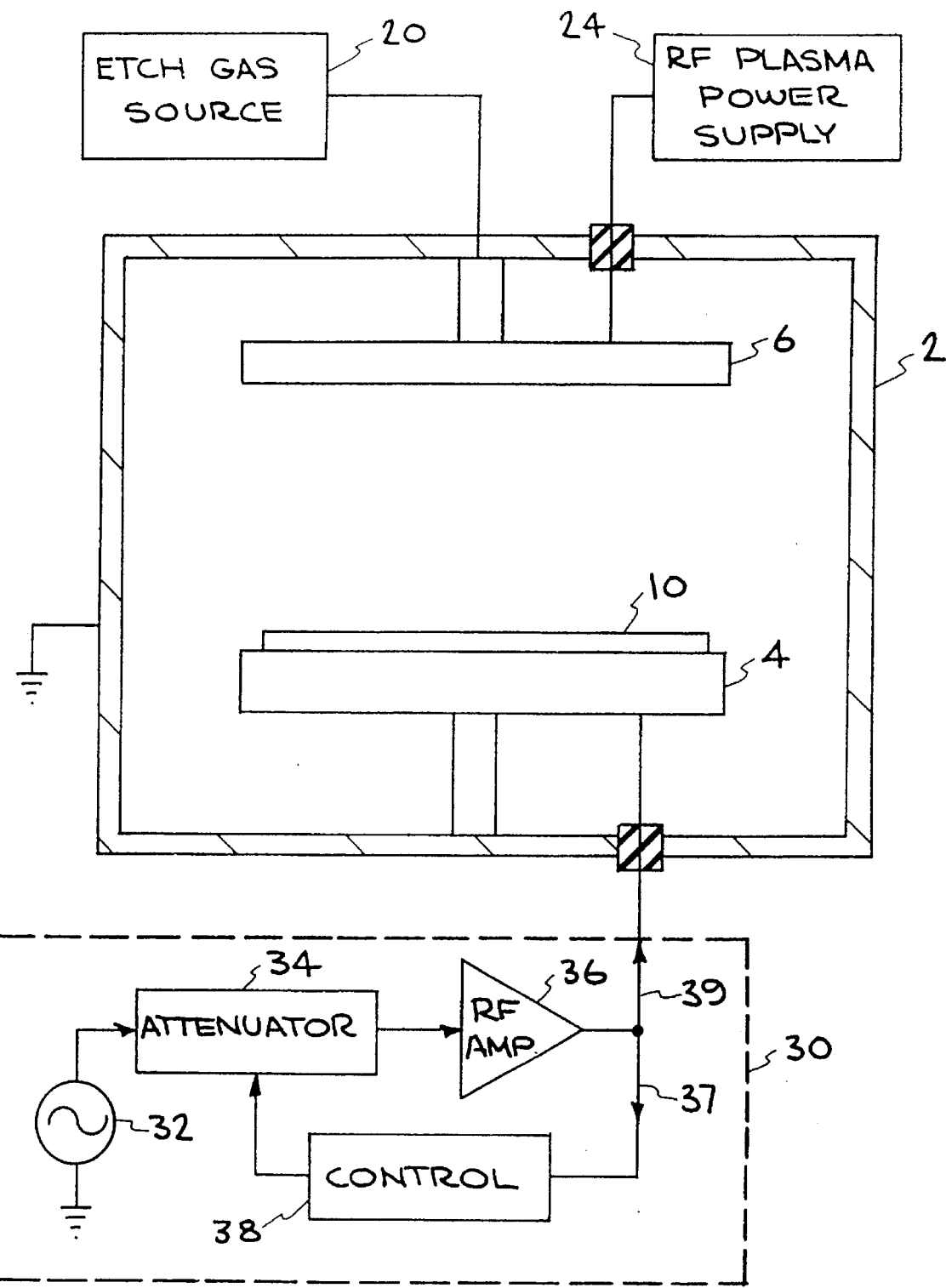
FIG. 1 is a diagrammatic view of a conventional prior art etch chamber showing in block diagram form, the components of a conventional prior art RF bias power supply which supplies bias power to a substrate support in the etch chamber to bias a substrate thereon during a conventional prior art plasma etch process.

Referring now to FIG. 1, a conventional plasma etch apparatus is shown comprising an etch chamber 2 having a substrate support structure 4 therein with a substrate 10 shown mounted thereon. Etch chamber 2 is also provided with a source 20 of etch gas or gases. The etch gas or gases may be supplied directly into chamber 2 through a showerhead 6, as shown in FIG. 1, when a plasma is formed directly in chamber 2 by providing a source of RF plasma power from an RF plasma power source 24 which is connected to showerhead 6 in chamber 2, so that showerhead 6 then also serves as one electrode, while grounded chamber 2 serves as the other electrode. Alternatively, the plasma may be generated in an adjoining chamber (not shown) which functions as a remote plasma generation source, e.g., an inductive plasma power source, in which case the etch gases may be introduced into such an adjoining chamber to be ionized before entering etch chamber 2.

As further shown in FIG. 1, substrate support structure 4 is provided with a basic RF bias thereon by electrical connection through line 39 to an RF supply 30 which comprises an RF power generator 32, a voltage control attenuator 34, a power amplifier 36 and a control feedback loop 37, which feeds back a portion of the output power from amplifier 36 to a control unit 38 which is then connected to voltage control attenuator 34. Examples of commercially available RF bias power supplies which are conventionally used to provide a basic RF bias power to a substrate support include ENI Model OEM-12AM and ENI Model OEM-12B-02 RF power supplies.

Figure 2:
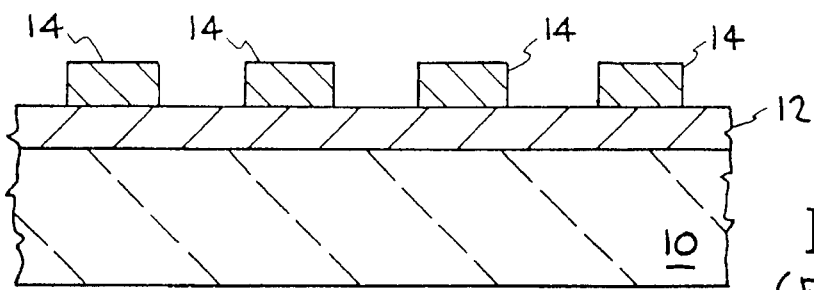
FIG. 2 is a fragmentary vertical cross-sectional view of a substrate having a metal layer thereon and a photoresist mask over the metal layer prior to the step of patterning the metal layer.
Figure 3:
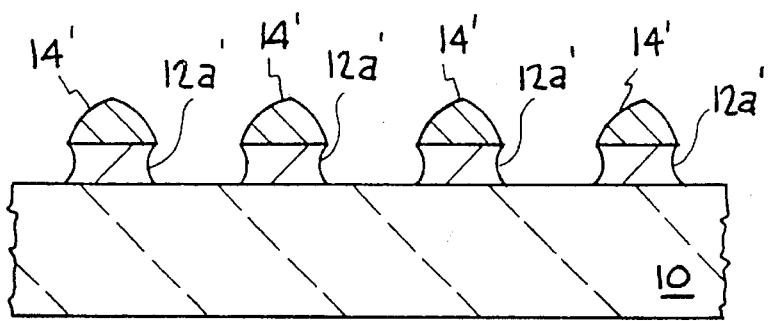
FIG. 3 is a fragmentary vertical cross-sectional view of the structure of FIG. 2 after patterning of the metal layer through the mask, using the prior art apparatus and process illustrated in FIG. 1, when the bias power supplied to the substrate support is set at a level high enough to remove etch residues as they form during the etch.

FIG. 2 shows a prior art structure comprising a metal layer 12 on substrate 10, such as an aluminum layer, having a photoresist mask 14 deposited over metal layer 12. When metal layer 12 is etched through photoresist mask 14, using the prior art apparatus just described with a chlorine chemistry such as a combination of $Cl_2$ and $BCl_3$ gases at a pressure of from about 10 milliTorr to about 250 milliTorr, the use of a substrate support bias power level which will not erode or damage resist mask 14 during the etching of metal layer 12, e.g., a basic bias power level equivalent to about 100 watts for a six inch diameter substrate, will not be sufficient to remove metal etch residues as they accumulate on substrate 10 during the etch. If, however, as illustrated in FIG. 3, the power level is raised to a level sufficient to remove etch residues, e.g., a basic bias power level equivalent to about 200 watts for a six inch diameter substrate, photoresist mask 14 will gradually erode during the etch, resulting in the structure shown in FIG. 3, with mask 14' eroded sufficiently to permit undercutting of the portion of the metal layer 12 under mask 14', as shown at 12a'. That is, portions 12a of metal layer 12 (as shown in FIG. 5) which should remain unetched and which will form portions of the desired metal interconnect or wiring harness to be formed from metal layer 12 are shown partially etched away in the prior art structure of FIG. 3.

Figure 5:
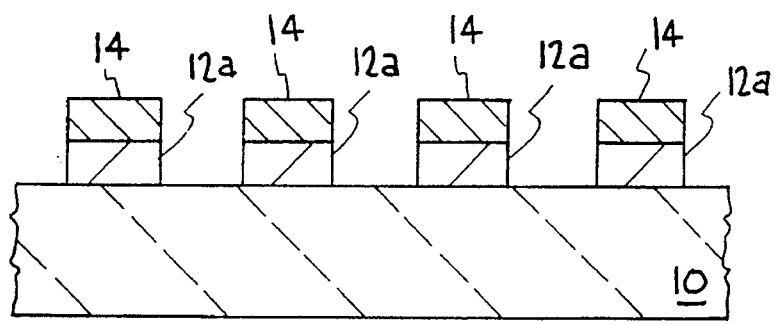
FIG. 5 is a fragmentary vertical cross-sectional view of the structure of FIG. 2 after patterning of the metal layer through the mask using the modified apparatus and process of the invention, as illustrated in FIG. 4, by using a basic bias power signal supplied to the substrate support at a power level insufficient to damage the photoresist mask, but also insufficient to remove the etch residues, with a periodic pulse bias power signal superimposed on the basic bias power signal, which pulse is set at a power level high enough to remove etch residues as they form during the etch, but of insufficient duration to damage the photoresist mask.
Figure 4:
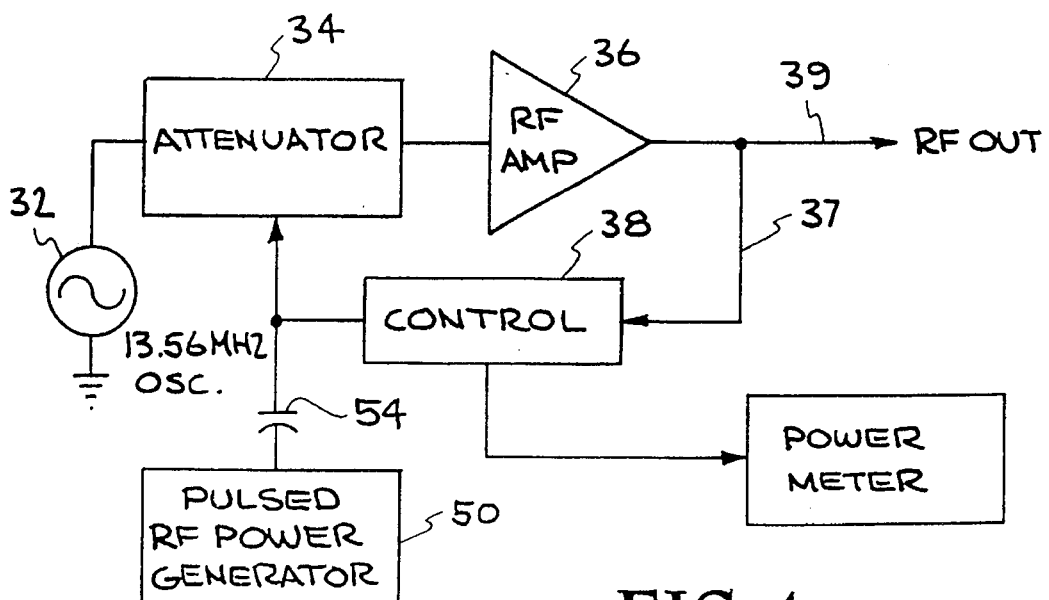
FIG. 4 is a diagrammatic view of the RF bias power supply of FIG. 1 modified, in accordance with the invention, to provide an amplitude modulated pulse of high RF power to the bias power being supplied to the substrate support. and the substrate thereon.

In accordance with the invention, as illustrated in FIGS. 4 and 5, RF basic bias power supply 30 is set to deliver a substrate basic bias power signal to substrate support structure 6 sufficient to etch a metal layer such as an aluminum layer on substrate 10 to form metal lines or interconnects 12a, as shown in FIG. 4, without any substantial erosion of the photoresist mask, but insufficient to remove metal etch residues as they accumulate on the surface of substrate 10 during the etch. The basic bias power signal will be equivalent to a basic bias power level for a six inch diameter substrate of about 100 watts, and may also be referred to as a basic "equivalent bias power level" as that term is defined below. This basic "equivalent bias power level" signal is then modulated, in accordance with the invention, by superimposing a periodic higher bias power pulse which is of sufficient magnitude (pulse height) to accomplish the desired removal of metal etch residues as they form, but of insufficient duration (pulse width) to damage the photoresist mask over the metal layer being etched.

The periodic higher bias power pulse may be provided to substrate support 4 by feeding a pulsed signal into voltage control attenuator 34 from a second or pulsed RF power generator 50 coupled to voltage control attenuator 34 of basic power supply 30 through a coupling capacitor 54, with second RF power generator 50 set to the desired pulse height, pulse duration, and frequency, as will be discussed below.

RF power generator 32 in RF power supply 30, used to provide the base bias power signal to the substrate support, and second RF power generator 50, used to provide the high power level pulses, may each comprise an RF generator capable of delivering an RF signal at any frequency within the normal RF range, i.e., from 2–100 mHz. Conveniently, a 13.56 mHz RF power generator may be utilized for either or both of the RF signal generators. A typical commercially available second RF power generator source capable of supplying a high power RF pulse of adjustable pulse height, adjustable pulse width, and adjustable pulse frequency is a Wavetek Model 395 waveform generator.

The pulse rate or repetition rate of the high power pulse delivered by RF power generator 50 will vary from about 5 kHz to about 20 kHz. A slower repetition or frequency rate can result in undercutting of the metal layer beneath the mask, which is believed to occur due to an insufficient amount of polymer forming on the sidewall of the metal line being formed beneath mask 14 as metal layer 12 is etched. The high end of the frequency range is more limited by the response time of the circuitry, rather than based on process limitations, with higher frequencies being usable if appropriate circuitry is available.

The peak level or height of the high power RF pulse should vary from a minimum "equivalent bias power level" of about 200 watts to a maximum "equivalent bias power level" of about 1000 watts, with the minimum wattage being governed by the minimum amount of power needed to effect the desired removal of the metal etch residues as they form during the patterning process. It should be noted that the term "equivalent bias power level", as used herein, is intended to define the basic bias power level and the peak of the pulsed bias power level required for a six inch diameter substrate, it being understood that the actual basic and pulsed bias power levels will need to be adjusted from such an "equivalent bias power level" when other sizes of substrate are utilized. The maximum pulse height or peak power level of the pulse is governed by the need to avoid damage to the photoresist mask. The preferred pulsed equivalent bias power peak level range will usually vary from about 200 to about 500 watts, with the optimum pulsed equivalent bias power peak level being related to the duration or width of the pulse, as will be discussed below.

It should be noted that the basic or pulsed equivalent bias power levels may also be expressed in watts per square centimeter (watts/cm$^2$). Thus, for a six inch diameter substrate, the basic bias power level may be expressed as about 1.72 watts/cm$^2$, and the pulsed bias power peak level may be expressed as ranging from about 3.45 watts/cm$^2$ to about 17.24 watts/cm$^2$, with the preferred maximum power level of the pulses comprising a power level of about 8.62 watts/cm$^2$.

The duration or pulse width of the high power pulse will range from about 5% to about 40% of the duty cycle, with less than about 5% deemed to be insufficient to obtain the desired metal etch residue removal, and a duration of more than about 40% causing too much erosion of the photoresist mask. A duration of from about 20 to about 30% of the duty cycle is preferred, with a duration of about 25% deemed to be optimal. However, the duration or width of the pulse is related to the level or pulse height of the high power pulse in an inverse relationship to determine the total amount of additional bias power being delivered to the substrate support during each duty cycle. Thus, the higher the level of power or pulse height during each pulse, the shorter the duration or pulse width should be within the limits of pulse height and pulse duration just discussed, and vice versa.

To further illustrate the process and apparatus of the invention, several six inch diameter silicon wafers were coated with a 1 micron thick aluminum layer and a 1.5 micron thick photoresist mask was formed over each metal layer.

Sequentially, each of the coated wafers was mounted on a wafer support in a 16 liter electrically grounded chamber maintained at a pressure of 12 milliTorr with a temperature of about 40° C. maintained on the wafer support. Each of the coated wafers was then patterned by a metal etch process which consisted of flowing 180 standard cubic centimeters per minute (sccm) of $Cl_2$ and 60 sccm of $BCl_3$ into the chamber while maintaining a plasma in the chamber at a power level of 1200 watts. In each instance, the etch was carried out for a total time period of about 1 minute.

One of the coated wafers was subjected to a conventional (prior art) RF biasing of the coated wafer during the patterning of the metal layer by applying a basic RF bias power to the wafer support at a level of about 100 watts. After the patterning step, the etched metal layer and overlying photoresist mask on the wafer were examined, using a Scanning Electron Microscope (SEM) for erosion of the resist mask and undercutting of the remaining portions of the metal layer remaining beneath the mask. No significant erosion of the mask or undercutting of the metal layer was evident. However, metal etch residues were present on the surface of the etched wafer, indicating that the basic bias power level used was insufficient to remove such etch residues.

A second coated wafer was also subjected to a conventional (prior art) RF biasing of the wafer during the patterning of the metal layer on the wafer, except that the basic bias power level applied to the wafer support was raised to 200 watts. When the wafer, including the etched metal layer and overlying resist mask, were examined in the same manner as above, no evidence of metal etch residues were found, but the resist mask was found to be severely eroded and undercutting of the underlying patterned metal layer was evident.

The metal layer on a third coated wafer was then patterned in accordance with the process and apparatus of the invention by providing a pulsed or modulated bias signal to the wafer support comprising a basic wafer support bias power level carrier signal at 100 watts and a superimposed pulse at a power level or pulse height of 200 watts, at a repetition rate or pulse frequency of 5 kHz, and a duration or pulse width of about 30% of each pulse cycle.

After completion of the patterning of the metal layer, this wafer was then examined in the same manner as described above. The resist mask was found to be free of erosion, no evidence of undercutting of the patterned metal layer was evident, and there were no visible metal etch residues present on the wafer.

Thus, the process and apparatus of the invention provides a patterning of a masked metal layer which inhibits or prevents erosion of the photoresist mask and undercutting of the patterned metal layer, while also providing sufficient bias power to the substrate to permit removal of metal etch residues which form during the patterning step.

Having thus described the invention, what is claimed is:

1. A process for patterning a masked metal layer to form a layer of metal interconnects for an integrated circuit structure which removes metal etch residues, while inhibiting or eliminating erosion of the photoresist mask, which comprises: forming a plasma in an etching chamber by applying a source of RF power to an electrode in said etching chamber spaced from a substrate to be etched in said etching chamber; connecting a source of basic RF bias power to a second electrode in said etching chamber comprising the support of the substrate being etched; providing an amplitude modulation of said basic RF bias power supplied to said second electrode comprising superimposing on said basic RF bias power short pulses of RF bias power of sufficient magnitude and of sufficient duration to remove metal etch residues as they form during the etch process while minimizing erosion of the photoresist etch mask or undercutting the metal layer.

2. The process of claim 1 wherein the repetition rate of said pulses of high bias power will comprise a minimum rate sufficient to avoid undercutting of said metal layer.

3. The process of claim 2 wherein the repetition rate of said pulses of high bias power will comprise a minimum rate of about 5 kHz to minimize undercutting of said metal layer.

4. The process of claim 2 wherein said pulse magnitude of said pulse of Rf power will comprise a minimum equivalent bias power level of at least about 200 watts to ensure removal of metal etch residues.

5. The process of claim 2 wherein said pulse magnitude of said pulse of Rf power will comprise a maximum equivalent bias power level of about 1000 watts to prevent erosion of said resist mask or undercutting of said metal layer.

6. The process of claim 2 wherein said pulse magnitude of said pulse of Rf power will comprise a minimum equivalent bias power level of at least about 200 watts to ensure removal of metal etch residues to a maximum equivalent bias power level of about 1000 watts to prevent erosion of said resist mask or undercutting of said metal layer.

7. The process of claim 2 wherein said pulse duration of said pulse of Rf power will comprise a minimum of at least about 5% of the duty cycle of said pulse to ensure adequate removal of said metal etch residues.

8. The process of claim 7 wherein said pulse duration of said pulse of Rf power will comprise a minimum of at least about 20% of the duty cycle of said pulse to ensure adequate removal of said metal etch residues.

9. The process of claim 2 wherein said pulse duration of said pulse of Rf power will comprise a maximum of about 40% of the duty cycle of said pulse to prevent erosion of said photoresist mask or undercutting of said metal layer.

10. The process of claim 9 wherein said pulse duration of said pulse of Rf power will comprise a maximum of about 30% of the duty cycle of said pulse to prevent erosion of said photoresist mask or undercutting of said metal layer.

11. The process of claim 2 wherein said pulse duration of said pulse of Rf power will comprise a minimum of at least about 5% of the duty cycle of said pulse to ensure adequate removal of said metal etch residues and a maximum of about 40% of the duty cycle of said pulse to prevent erosion of said photoresist mask or undercutting of said metal layer.

12. The process of claim 2 wherein the equivalent bias power level of the basic bias power supplied to said substrate support comprises about 100 watts.

13. A process for patterning a masked metal layer to form a layer of metal interconnects for an integrated circuit structure which removes metal etch residues, while inhibiting or eliminating erosion of the photoresist mask, which comprises:

a) forming a plasma in an etching chamber by applying a source of RF power to an electrode in said etching chamber spaced from a substrate to be etched in said etching chamber;

b) supplying basic RF bias power to a second electrode in said etching chamber comprising the substrate support of the substrate being etched; and c) providing an amplitude modulation of said basic RF bias power supplied to said second electrode comprising superimposing on said basic RF bias power short pulses of RF power of an equivalent bias power level of from about 200 watts to about 1000 watts, a repetition rate of at least about 5 kHz, and of a duration of from about 5% to about 40% of the duty cycle of said pulses to remove metal etch residues as they form during the etch process while minimizing erosion of the photoresist etch mask or undercutting the metal layer.

14. The process of claim 13 wherein the equivalent bias power level of the basic bias power supplied to said substrate support comprises about 100 watts.

15. RF etching apparatus for patterning a masked metal layer to form a layer of metal interconnects for an integrated circuit structure which removes metal etch residues, while inhibiting or eliminating erosion of the photoresist mask, which comprises:

a) a plasma etch chamber;

b) an RF power supply, capable of generating a plasma within said chamber, electrically connected to a showerhead electrode in said etch chamber;

c) an RF bias power source electrically connected to an substrate support electrode in said plasma etch chamber facing said showerhead electrode to provide a constant RF bias power to said substrate support;

d) apparatus for providing an amplitude modulation of the RF bias power supplied to said substrate support electrode within said plasma etch chamber which supports a substrate being etched comprising a pulsed RF power source capable of superimposing short pulses of RF bias power on said constant RF bias power of sufficient bias power level (pulse height) and of sufficient duration (pulse width) to remove metal etch residues as they form during the etch process without, however, eroding the photoresist etch mask or undercutting the metal layer.

16. The apparatus of claim 15 wherein said RF power source capable of superimposing short pulses of RF bias power is capable of providing such pulses at a minimum repetition rate sufficient to prevent undercutting of said metal layer.

17. The apparatus of claim 16 wherein said repetition rate of said pulses of high power bias range will comprise a minimum rate of about 5 kHz to prevent undercutting of said metal layer.

18. The apparatus of claim 16 wherein said pulse magnitude of said pulse of Rf power will comprise a minimum equivalent bias power level of at least about 200 watts to ensure removal of metal etch residues.

19. The apparatus of claim 16 wherein said pulse magnitude of said pulse of Rf power will comprise a maximum equivalent bias power level of about 1000 watts to prevent erosion of said resist mask or undercutting of said metal layer.

20. The apparatus of claim 16 wherein said pulse duration of said pulse of Rf power will comprise a minimum of at least about 5% of the duty cycle of said pulse to ensure adequate removal of said metal etch residues.

21. The apparatus of claim 16 wherein said pulse duration of said pulse of Rf power will comprise a maximum of about 40% of the duty cycle of said pulse to prevent erosion of said photoresist mask or undercutting of said metal layer.

22. Plasma etching apparatus for patterning a masked metal layer to form a layer of metal interconnects for an integrated circuit structure which removes metal etch residues, while inhibiting or eliminating erosion of the photoresist mask, which comprises:

a) a plasma etch chamber;

b) an RF power supply, capable of generating a plasma within said chamber, electrically connected to a showerhead electrode in said etch chamber;

c) an RF bias power source electrically connected to an substrate support electrode in said plasma etch chamber facing said showerhead electrode to provide a constant RF bias power to said substrate support;

d) apparatus for providing an amplitude modulation of the RF bias power supplied to said substrate support electrode within said plasma etch chamber which supports a substrate being etched comprising a pulsed RF power source capable of superimposing short pulses of RF bias power of a magnitude (pulse height) equivalent to from about 200 watts to about 1000 watts for a six inch diameter substrate, a repetition rate of at least about 5 kHz, and of a duration (pulse width) of from about 5% to about 40% of the duty cycle of said pulses to remove metal etch residues as they form during the etch process without, however, eroding the photoresist etch mask or undercutting the metal layer.

* * * * *